(12) United States Patent
Yamada et al.

(10) Patent No.: US 6,175,121 B1
(45) Date of Patent: Jan. 16, 2001

(54) BLOCK MASK AND CHARGED PARTICLE BEAM EXPOSURE METHOD AND APPARATUS USING THE SAME

(75) Inventors: Akio Yamada; Hiroshi Yasuda, both of Kawasaki (JP)

(73) Assignee: Fujitsu Limited, Kawasaki (JP)

(*) Notice: Under 35 U.S.C. 154(b), the term of this patent shall be extended for 0 days.

(21) Appl. No.: 09/159,603

(22) Filed: Sep. 24, 1998

Related U.S. Application Data

(62) Division of application No. 08/512,912, filed on Aug. 9, 1995, now Pat. No. 5,849,436.

(30) Foreign Application Priority Data

Sep. 16, 1994 (JP) .................................................. 6-222233

(51) Int. Cl.[7] .................................................. H01J 37/302
(52) U.S. Cl. .................................. 250/492.22; 250/492.2
(58) Field of Search ........................... 250/492.2, 492.22, 250/398

(56) References Cited

U.S. PATENT DOCUMENTS

| | | | |
|---|---|---|---|
| 4,424,450 | 1/1984 | Ward et al. ...................... | 250/492.22 |
| 4,445,039 | 4/1984 | Yew ................................. | 250/492.22 |
| 5,288,567 | 2/1994 | Sakamoto et al. ................ | 430/5 |
| 5,432,314 | 7/1995 | Yamazaki et al. ................ | 430/5 |
| 5,537,487 | * 7/1996 | Miyajima et al. ................ | 382/144 |
| 5,674,413 | 10/1997 | Pfeiffer et al. ................... | 430/5 |
| 5,849,436 | * 12/1998 | Yamada et al. ................... | 250/492.22 |

* cited by examiner

Primary Examiner—Bruce C. Anderson
(74) Attorney, Agent, or Firm—Armstrong, Westerman, Hattori, McLeland & Naughton

(57) ABSTRACT

A block mask for making a charged particle beam exposure using block exposure includes a plurality of block mask patterns respectively including repeating patterns, where the block mask patterns are arranged in an order dependent on an exposure sequence, at least one first block mask pattern group made up of arbitrary ones of the block mask patterns which are arranged in a predetermined direction, and at least one second block mask pattern group made up of the arbitrary ones of the block mask patterns which are arranged in a direction opposite to the predetermined direction. The second block mask pattern group is arranged adjacent to the first block mask pattern group.

12 Claims, 10 Drawing Sheets

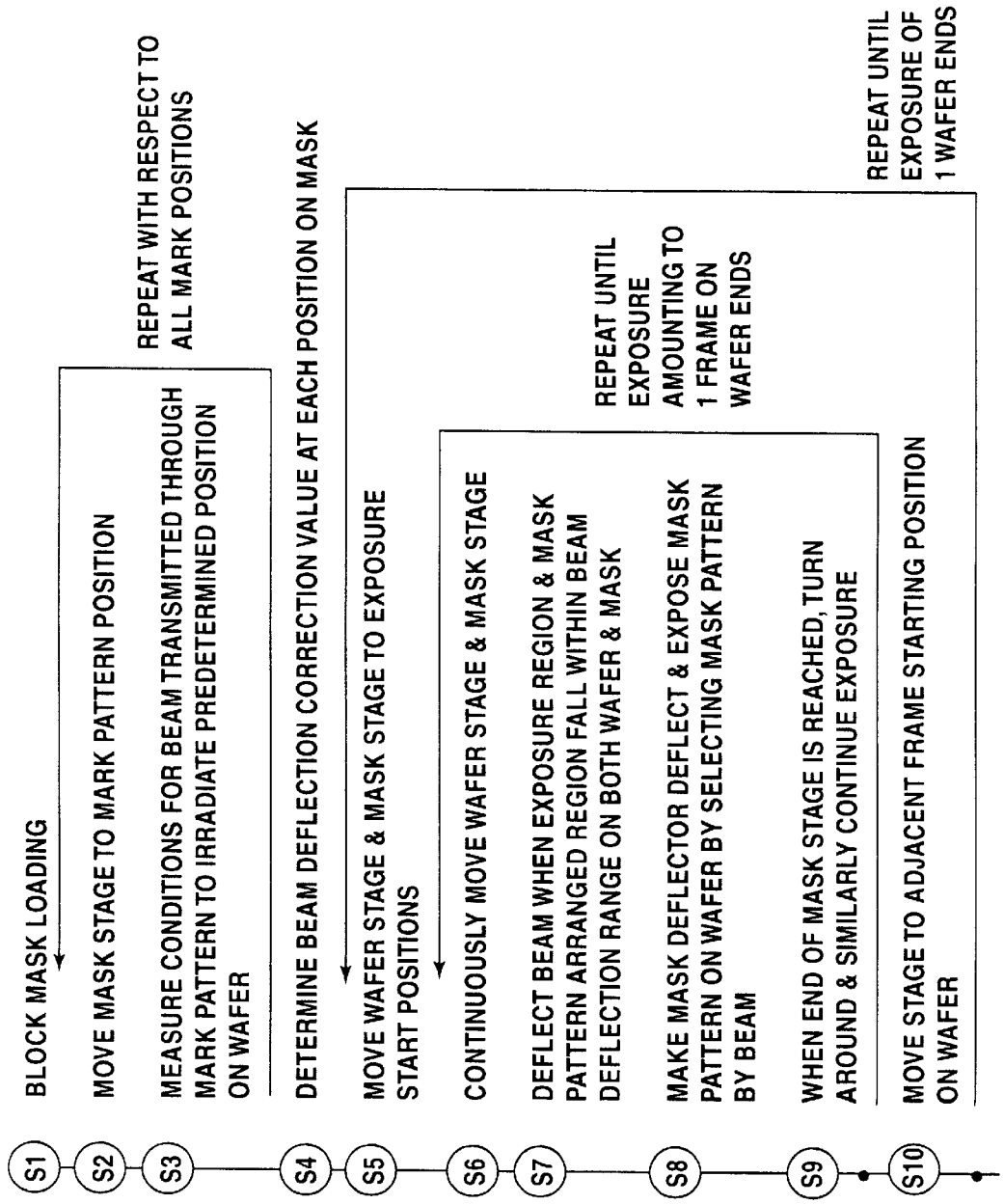

1

BLOCK MASK AND CHARGED PARTICLE BEAM EXPOSURE METHOD AND APPARATUS USING THE SAME

This is a divisional of application Ser. No. 08/512,912 filed Aug. 9, 1995, which issued as U.S. Pat. No. 5,849,436 on Dec. 15, 1998.

BACKGROUND OF THE INVENTION

The present invention generally relates to block masks and charged particle beam exposure methods and apparatuses which use such masks, and more particularly to a block mask having repeating basic unit patterns and to a charged particle beam exposure method and a charged particle beam exposure apparatus which use such a block mask to expose the unit patterns in one shot.

Conventionally, the photolithography technique was popularly used to form patterns on a semiconductor wafer. But because the integration density of integrated circuits have recently become high, the exposure technique used to form patterns on the semiconductor wafer is about to change from the photolithography technique to the charged particle beam exposure technique which uses a charged particle beam such as an electron beam.

There are various kinds of charged particle beam exposure techniques such as the variable rectangular exposure technique and the block exposure technique, depending on the shapes of the patterns that may be generated at one time. The variable rectangular exposure technique varies the size of the exposed pattern by varying the overlap of an aperture for use in variable rectangular exposure and the beam spot of the charged particle beam. According to the block exposure technique, the charged particle beam is transmitted through a mask having repeating basic unit patterns, and the unit patterns are exposed in one shot even for complicated patterns. Hence, the block exposure technique is particularly effective when exposing patterns which are fine but most of the area to be exposed consists of repeating basic patterns, such as the case of the patterns of a 256 Mbit dynamic random access memory (DRAM).

FIG. 1 shows an example of a conventional electron beam exposure apparatus employing the block exposure. The electron beam exposure apparatus shown in FIG. 1 generally includes an electron gun 101, an electron lens system L1a, a plate 102 with a rectangular opening, an electron lens system L1b, a beam shaping deflector 103, a first mask deflector MD1, a dynamic mask stigmator DS, a second mask deflector MD2, a dynamic mask focus coil DF, an electron lens system L2a, a mask stage 105 mounted with a block mask 104, an electron lens system L2b, a third mask deflector MD3, a blanking deflector 106, a fourth mask deflector MD4, a reduction electron lens system L3, a circular aperture 107, a projection electron lens system L4, a main deflector (electromagnetic deflector) 108, a sub deflector (electrostatic deflector) 109, a projection electron lens system L5, a wafer stage 111 mounted with a wafer 110, and a control system.

The control system includes a central processing unit (CPU) 121, a clock unit 122 which generates various kinds of clock signals including an exposure clock signal, a buffer memory 123, a control unit 124, a data correction unit 125, a mask memory 126, and a main deflector setting unit 127. The CPU 121 which controls the operation of the entire electron beam exposure apparatus, the clock unit 122, the mask memory 126 and the main deflector setting unit 127 are coupled via a bus 128.

For the sake of convenience, the data correction unit 125 and the main deflector setting unit 127 are shown in FIG. 1 as including the functions of a digital-to-analog converter and an amplifier. In addition, a laser interferometer which measures the position of the wafer stage 111 and a stage moving mechanism which moves the wafer state 111 are respectively known from U.S. Pat. No. 5,173,582 and No. 5,194,741, for example, and an illustration and description thereof will be omitted in this specification.

An electron beam emitted from the electron gun 10 passes through the rectangular hole of the plate 102, and is deflected by the first and second deflectors MD1 and MD2 before passing a desired pattern portion of the block mask 104. The cross sectional shape of the electron beam is shaped depending on the desired pattern portion, and the electron beam is swung back to an optical axis of the system by the converging functions of the electron lens systems L2a and L2b and the deflecting functions of the third and fourth deflectors MD3 and MD4. Thereafter, the cross section of the electron beam is reduced by the reduction electron lens system L3, and irradiated on the wafer 110 via the projection electron lens systems L4 and L5, thereby exposing the desired pattern on the wafer 110.

Exposure pattern data related to the patterns to be exposed on the wafer 110, block data related to mask patterns on the block mask 104 and the like are stored in the buffer memory 123. The exposure pattern data includes main deflection data to be supplied to the main deflector 108 and the like. In addition, data related to the relationships of the deflection data and the mask pattern positions which are measured in advance prior to the exposure, correction data for correcting the deflection data to be supplied to the dynamic mask stigmator DS and the dynamic mask focus coil DF and the like are stored in the mask memory 126.

The exposure pattern data received by the CPU 121 from a host unit (not show) or the like and stored in the buffer memory 123 includes a pattern data code PDC which indicates which mask pattern of the block mask 104 is to be used for the exposure. The control unit 124 uses this pattern data code PDC to read from the mask memory 126 the deflection data for deflecting the electron beam to the position of the mask pattern to be used. The control unit 124 supplies the read deflection data to the first through fourth deflectors MD1 through MD4 which are used for the pattern selection. In addition, the deflection data read from the mask memory 126 are also supplied to the data correction unit 125. The deflection data are read from the mask memory 126 based on an exposure clock signal which is generated by the clock unit 122.

On the other hand, the main deflector setting unit 127 reads from the buffer memory 123 the main deflection data of the main deflector 108 based on the clock signal from the clock unit 122, and supplies the read main deflection data to the main deflector 108. In addition, the deflection data of the sub deflector 109, the deflection data of the beam shaping deflector 103, and the deflection data of the blanking deflector 106 are decomposed into shot data in the control unit 124 depending on the data stored in the buffer memory 123. The shot data are supplied to the corresponding sub deflector 109, the beam shaping deflector 103 and the blanking deflector 106 via the data correction unit 125. In other words, the control unit 124 depending on the data stored in the buffer memory 123, the control unit 124 obtains and supplies to the data correction unit 125 the size of the electron beam for the case where the variable rectangular exposure is to be made and the deflection position of the electron beam on the block mask 104. The data correction unit 125 corrects each of the deflection data of the electron beam which are dependent on the patterns to be exposed and are supplied from the control unit 124, based on the correction data read from the mask memory 126. The deflection data of the beam shaping deflector 103 determine the variable rectangular size of the electron beam, and the deflection data of the blanking deflector 196 are set for each exposure shot.

FIGS. 2A and 2B show an example of the block mask 104 for a memory. As shown in FIG. 2A, the block mask 104 is made up of a substrate 104a which is made of a semiconductor such as silicon or a metal, and a plurality of deflection areas 104-1 through 104-12 provided on this substrate 104a. A plurality of mask patterns are formed in each of the deflection areas 104-1 through 104-12. In the electron beam exposure apparatus that employs the block exposure, the range of the mask patterns which are selectable by deflecting the electron beam about a position of the mask stage 105 is determined in advance, and each of the deflection areas 104-1 through 104-12 are a square range with a side of 5 mm, for example, and corresponding to the determined range of the selectable patterns. For example, when exposing a pattern by selecting the mask pattern within the deflection area 104-8, the mask stage 105 is moved so that the electron optical axis of the electron beam exposure apparatus approximately matches the center of the deflection area 104-8.

FIG. 2B shows the construction of the deflection area 104-8. In FIG. 2B, RDR denotes a row decoder region, CR denotes a cell region, and CDR denotes a column decoder region. For example, 48 block patterns can be arranged within this deflection area 104-8, and each block pattern is recognized by the pattern data code PDC. In other words, the pattern data code PDC is a mark for reading the contents of the mask memory 126 in correspondence with each of the mask patterns based on the exposure clock signal from the clock unit 122, where the exposure clock signal has a maximum frequency of 10 MHz, for example. As described above, the mask memory 126 stores the relationships of the mask pattern positions and the deflection data for deflecting the electron beam to each of the mask pattern positions, the correction data to be supplied to the dynamic mask stigmator DS and the dynamic mask focus coil DF and the like. Such data are stored in the mask memory 126 by adjusting the electron beam prior to the exposure and obtaining the deflection data, the correction data and the like with respect to the deflection areas that are to be used.

When changing the deflection area to be used, the mask stage 105 is moved so that the electron optical axis of the electron beam exposure apparatus matches the center of the newly selected deflection area. As the mask stage 105 is moved, a deflection calibration is made with respect to the newly selected deflection area, and it is also necessary to rewrite the data within the mask memory 126. Although it is not impossible to provide this calibration process within the exposure routine of the CPU 121, this approach is not realistic in that the adjustments related to the calibration take considerable time. Accordingly, in the conventional electron beam exposure apparatus employing the block exposure, there was a problem in that the number of block patterns which are selectable during the exposure of the patterns of one kind or one layer is limited to the number of block patterns within one deflection area on the block mask 104. In other words, in the case of the example described above, only 48 block patterns can be selected. As a result, even if apertures for use in the variable rectangular exposure are arranged within one deflection area, it is still only possible to select the 48 block patterns and the apertures for use in the variable rectangular exposure.

If the patterns are highly repetitive, such as the case of the patterns of the memory, it may be possible to expose the patterns using only the 48 block patterns and the apertures for use in the variable rectangular exposure, for example. However, if the patterns are not of a memory and include patterns which are random to a certain extent, 48 block patterns are not enough to expose all of the patterns, and in addition, it is impossible to form all of the repeating patterns within one deflection area of the block mask 104. In other words, there is a limit to the number of block patterns that may be formed within one deflection area of the block mask 104, and if all of the patterns to be exposed cannot be formed solely by the block patterns within one deflection area, the only way to form the remaining patterns is to use the apertures that are provided for the variable rectangular exposure. However, the frequent use of the apertures for the variable rectangular exposure reduces the exposure speed and accordingly increases the exposure time, and there was a problem in that the throughput of the electron beam exposure apparatus deteriorates.

SUMMARY OF THE INVENTION

Accordingly, it is a general object of the present invention to provide a novel and useful mask and charged particle beam exposure method and apparatus which use such a mask, in which the problems described above are eliminated.

Another and more specific object of the present invention is to provide a block mask, a charged particle beam exposure method and a charged particle beam exposure method which limit the number of block patterns that are selectable during the exposure and carry out the exposure while continuously moving the block mask, so that the reduction of the exposure speed and the increase of the exposure time are prevented, thereby improving the throughput of the charged particle beam exposure apparatus.

Still another object of the present invention is to provide a block mask for making a charged particle beam exposure using block exposure, comprising a plurality of block mask patterns respectively including repeating patterns, where the block mask patterns are arranged in an order dependent on an exposure sequence, at least one first block mask pattern group made up of arbitrary ones of the block mask patterns which are arranged in a predetermined direction, and at least one second block mask pattern group made up of the arbitrary ones of the block mask patterns which are arranged in a direction opposite to the predetermined direction, where the second block mask pattern group is arranged adjacent to the first block mask pattern group. According to the block mask according to the present invention, there is substantially no limit to the number of block patterns that may be provided on the block mask, and it is possible to provide all repeating patterns on the block mask. For this reason, even if the patterns to be exposed include patterns which are random to a certain extent, it is possible to make a block exposure of the patterns, thereby improving the throughput of the charged particle beam exposure apparatus.

A further object of the present invention is to provide a block mask which further comprises mark patterns for detecting a position on the block mask. The mark patterns are arranged between at least two mutually adjacent first and second block mask pattern groups. According to the block mask of the present invention, it is possible to accurately detect the position on the block mask using the mark patterns, and decrease in the number of block mask patterns that may be provided on the block mask due to the provision of the mark patterns is negligible.

Another object of the present invention is to provide a charged particle beam exposure method for making a block exposure on a member using a block mask which has a plurality of block mask patterns respectively including repeating patterns, comprising the steps of (a) mounting on a movable stage a block mask having the block mask patterns arranged in an order dependent on an exposure sequence, and (b) deflecting a charged particle beam that is transmitted through the block mask and reaches the member based on deflection data while continuously moving the block mask by the movable stage so that a pattern in the plurality of block mask patterns is exposed on the member. According to the charged particle beam exposure method of the present invention, it is possible to eliminate the limit to the number of block patterns selectable during the exposure. In addition, by continuously moving the block mask during the exposure, it is possible to prevent the reduction of the exposure speed and the increase of the exposure time, thereby improving the throughput of the charged particle beam exposure apparatus.

Still another object of the present invention is to provide the charged particle beam exposure method which further comprises the steps of (c) continuously moving the member. According to the charged particle beam exposure method of the present invention, it is possible to prevent the increase of the exposure time because both the block mask and the member are continuously moved.

A further object of the present invention is to provide the charged particle beam exposure method which further comprises the steps of (c) generating the deflection data based on a present position of the block mask, reference points of each of the block mask patterns, and positions of patterns within each of the bock mask patterns with reference to each of the reference points. According to the charged particle beam exposure method of the present invention, it is possible to generate the deflection data for accurately deflecting the charged particle beam with respect to the block mask patterns of the moving block mask.

Another object of the present invention is to provide the charged particle beam exposure method which further comprises the steps of (c) obtaining a first signal indicating that a position of the block mask falls within a deflectable range of the charged particle beam on the block mask and a second signal indicating that a position of the member falls within a drawable range of the charged particle beam on the member, and controlling a start of an exposure operation based on a logical product of the first and second signals. According to the charged particle beam exposure method of the present invention, it is possible to start the exposure operation only in a state where the exposure is possible.

Still another object of the present invention is to provide a charged particle beam exposure apparatus for making a block exposure on a member using a block mask which has a plurality of block mask patterns respectively including repeating patterns, where the block mask patterns are arranged in an order dependent on an exposure sequence, and the charged particle beam exposure apparatus comprises first means for continuously moving the block mask, and second means for deflecting a charged particle beam that is transmitted through the block mask and reaches the member based on deflection data while continuously moving the block mask by the first means so that a pattern in the plurality of block mask patterns is exposed on the member. According to the charged particle beam exposure apparatus of the present invention, it is possible to eliminate the limit to the number of block patterns selectable during the exposure. In addition, by continuously moving the block mask during the exposure, it is possible to prevent the reduction of the exposure speed and the increase of the exposure time, thereby improving the throughput of the charged particle beam exposure apparatus.

Other objects and further features of the present invention will be apparent from the following detailed description when read in conjunction with the accompanying drawings.

BRIEF DESCRIPTION OF THE DRAWINGS

FIG. 10 is a flow chart for explaining the overall operation of the embodiment of the exposure apparatus.

DESCRIPTION OF THE PREFERRED EMBODIMENTS

First, a description will be given of an embodiment of a charged particle beam exposure method according to the present invention, by referring to FIGS. 3 through 6. In this embodiment of the exposure method, the present invention is applied to the electron beam exposure.

Figure 2A:
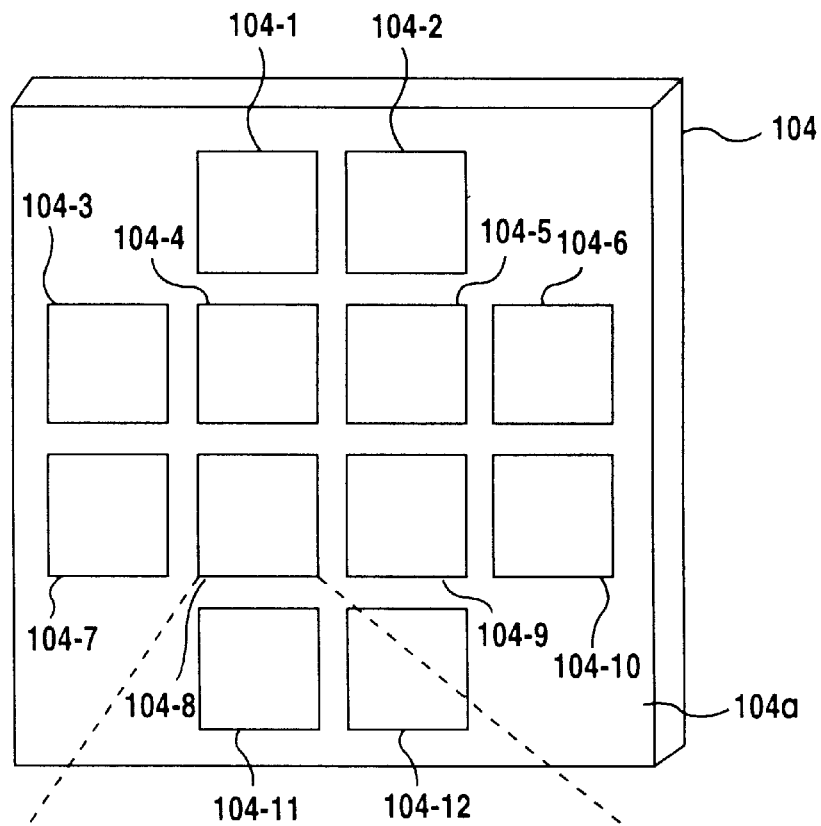
FIGS. 2A and 2B respectively are plan views for explaining an example of a block mask.
Figure 2B:
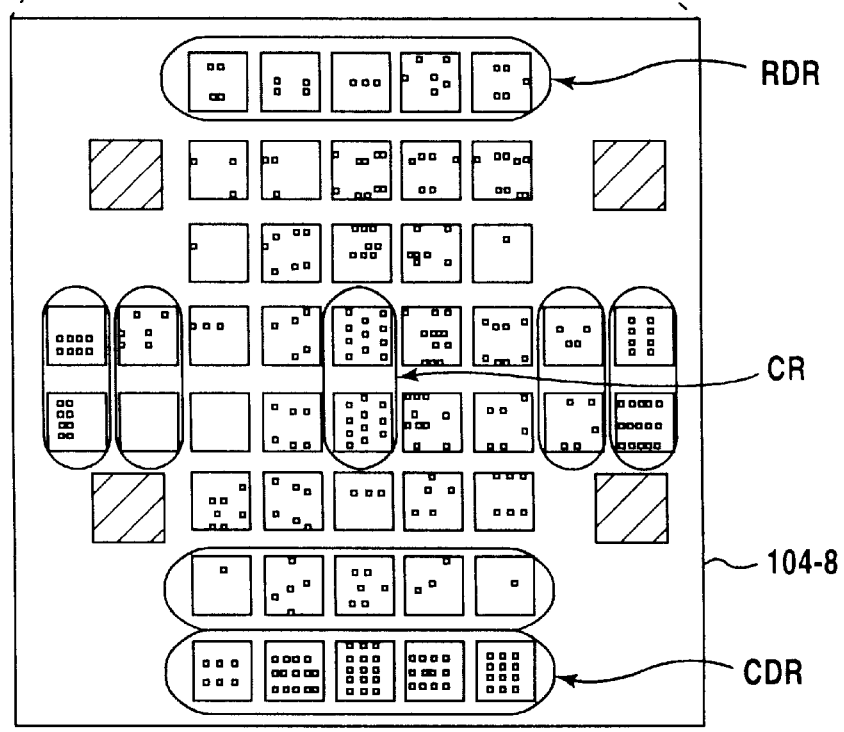
Figure 3:
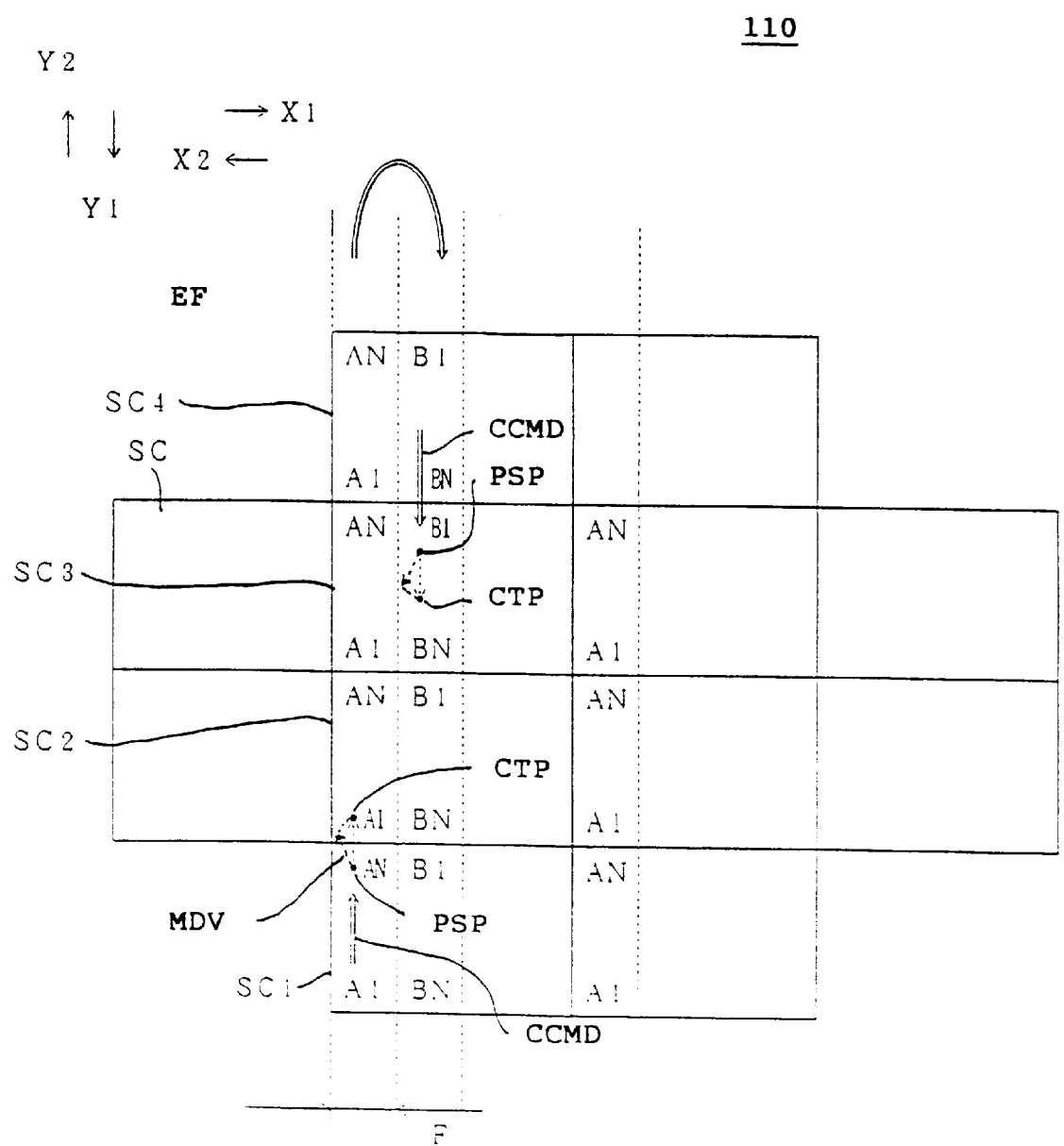
FIG. 3 is a plan view of a wafer for explaining an embodiment of a charged particle beam exposure method according to the present invention.
Figure 4:
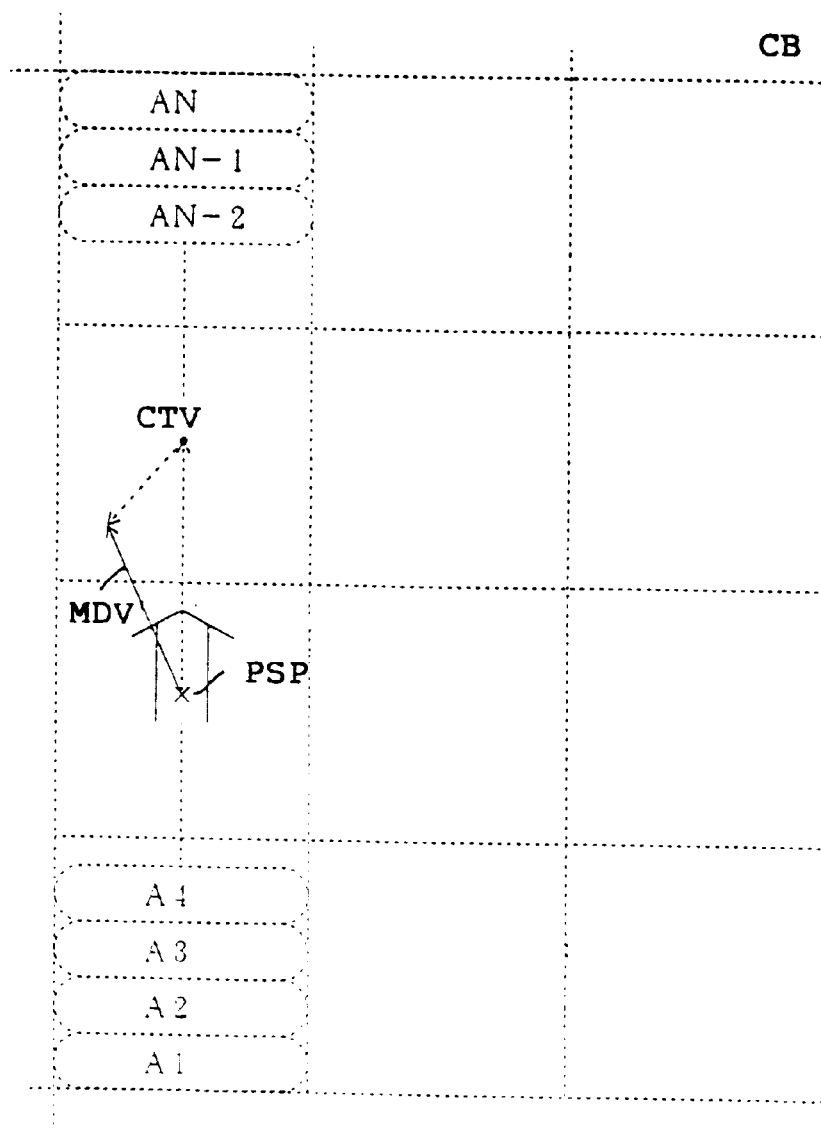
FIG. 4 is a plan view showing a part of FIG. 3 on an enlarged scale.

FIG. 3 shows a plan view of a wafer 110 which is mounted on a wafer stage (not shown), and FIG. 4 shows a plan view of a part of FIG. 2 on an enlarged scale. In FIG. 3, a column center moving direction CCMD refers to a moving direction of a center of a column (optical system) of the exposure apparatus. In addition, a cell target position CTP refers to a deflection field of the main deflector. In other words, the pattern to be drawn is described by position coordinates having the cell target position CTP as the center. A present stage position of the wafer stage is denoted by PSP, a main deflection vector is denoted by MDV, and an exposure frame is denoted by EF.

In FIG. 3, each rectangular region SC indicated by a solid line corresponds to one semiconductor chip which is a memory chip, for example. The wafer stage is continuously moved from one end to the other end of the wafer 110, that is, in the directions Y1 and Y2. When the rectangular region SC enters a drawable region of the electron beam as the wafer stage moves, the electron beam is deflected by a main deflector so as to draw patterns within a block mask pattern of a block mask (not shown).

In this case, 1 frame width F of a rectangular region SC1 is first drawn using block mask patterns A1 through AN of the block mask while the wafer stage moves in the direction Y1, where N is a positive integer, and then, 1 frame width F of an adjacent rectangular region SC2 is drawn using the block mask patterns A1 through AN. Further, 1 frame width F of a rectangular region SC3 is drawn using block mask patterns A1 through AN of the block mask, and thereafter, 1 frame width F of an adjacent rectangular region SC4 is drawn using the block mask patterns A1 through AN. 1 frame width F is drawn using the block mask patterns A1 through AN similarly with respect to other rectangular regions. The block mask patterns A1 through AN respectively are aperture patterns for shaping the cross sectional shape of the electron beam.

Next, the wafer stage is moved 1 frame width F in a direction X1, while being continuously moved in the direction Y2. While the wafer stage moves in the direction Y2, a frame width F of the rectangular region SC4 is first drawn using block mask patterns B1 through BN of the block mask, and then, 1 frame width F of the adjacent rectangular region SC3 is drawn using the block mask patterns B1 through BN. Further, 1 frame width F of the rectangular region SC2 is drawn using block mask patterns B1 through BN of the block mask, and thereafter, 1 frame width F of the adjacent rectangular region SC1 is drawn using the block mask patterns B1 through BN. 1 frame width F is drawn using the block mask patterns B1 through BN similarly with respect to the other rectangular regions. The block mask patterns B1 through BN respectively are aperture patterns for shaping the cross sectional shape of the electron beam to shapes different from those shaped by the block mask patterns A1 through AN.

Similarly thereafter, an operation in which an amount corresponding to 1 frame width F is drawn using an arbitrary one of the block mask patterns with respect to each of the rectangular regions SC arranged along the direction Y2 on the wafer 110, and an amount corresponding to the next 1 frame width F in the direction X1 is drawn using an arbitrary one of the block mask patterns with respect to each of the rectangular regions SC arranged along the direction Y1 on the wafer 110, is carried out with respect to each of the columns of the rectangular regions SC arranged in the directions Y1 and Y2.

As described above, when drawing an amount corresponding to 1 frame width F of 1 column of rectangular regions using a specific block mask pattern group, the block mask is continuously moved as will be described later. In other words, according to this embodiment of the exposure method, each of the rectangular regions SC of the wafer 110 are drawn while continuously moving both the wafer stage and the mask stage.

FIG. 4 shows the rectangular region SC2 shown in FIG. 3 on an enlarged scale. In FIG. 4, "x" indicates the present stage position PSP, and an arrow Y indicates the relative moving direction (Y2) of the electron beam on the wafer 110 due to the movement of the wafer stage in the direction Y1. Accordingly, when drawing a pattern using one of the block mask patterns A1 through AN of the block mask, the electron beam is deflected by the main deflector about the present stage position PSP indicated by "x" as indicated by the main deflection vector MDV.

Each block mask pattern Ai of the block mask includes patterns required to expose a corresponding exposure region Ai on the wafer 110 shown in FIG. 4, where i=1, . . . , N. In other words, each block mask pattern Ai of the block mask as a whole includes the block patterns and the apertures for use in the variable rectangular exposure to expose the corresponding exposure region Ai on the wafer 110.

Generally, even when the patterns of 1 semiconductor chip as a whole are random, in most cases the patterns are repetitively used to a certain extent within a narrow range in the semiconductor chip. Hence, this embodiment of the exposure method uses a block mask also having block mask patterns corresponding to the repeating patterns within the narrow range of the semiconductor chip. In addition, the block mask patterns are formed on the block mask depending on the exposure positions within the semiconductor chip and also depending on the exposure sequence that is followed when drawing along each frame width F.

Figure 5:
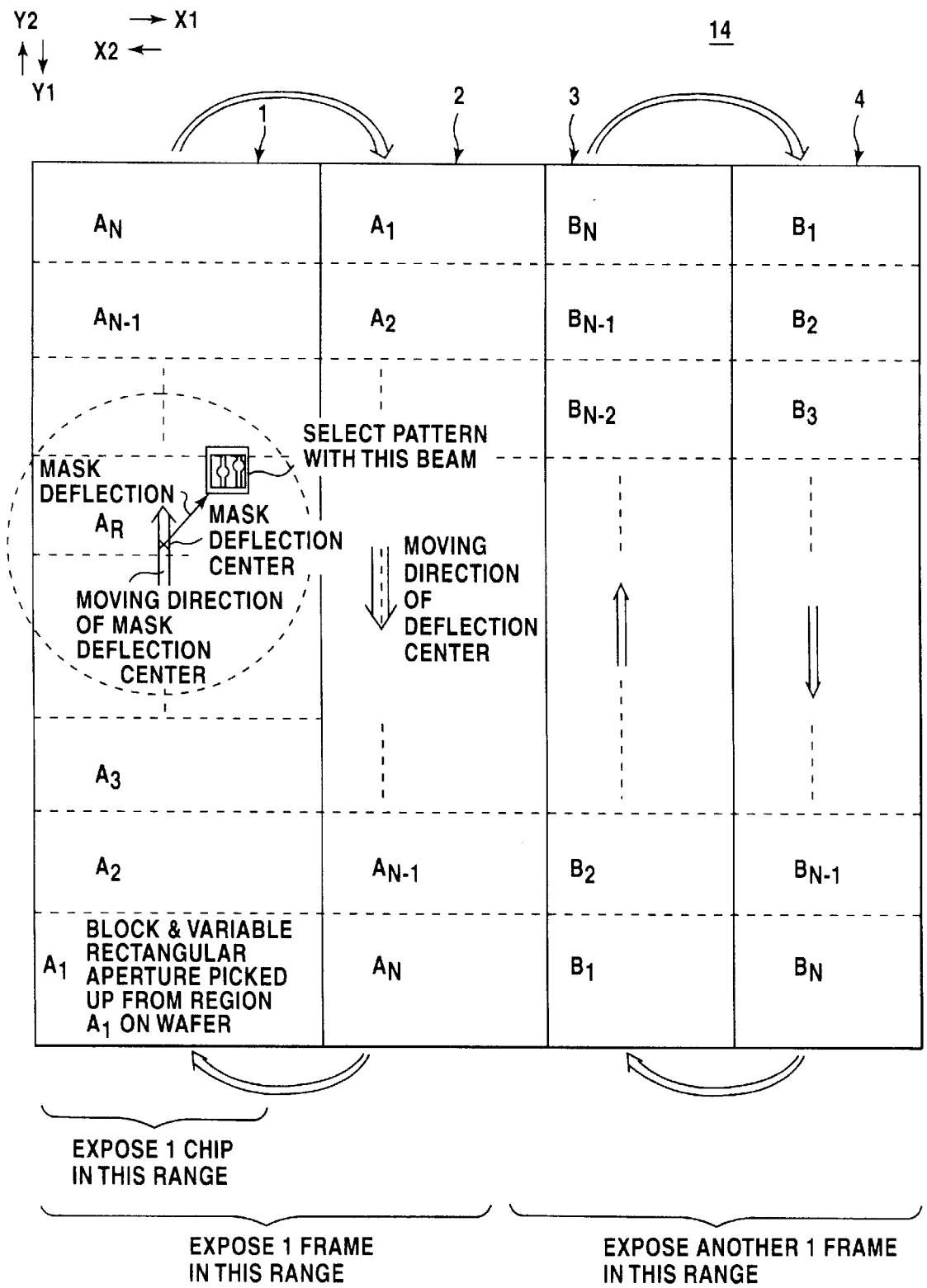
FIG. 5 is a plan view showing a part of an embodiment of a block mask according to the present invention.

FIG. 5 shows a plan view of a part of an embodiment of a block mask according to the present invention, which block mask is used in this embodiment of the exposure method. In FIG. 5, block mask pattern groups 1, 2, 3 and 4 are formed on a block mask 14. The block mask patterns A1 through AN are arranged along the direction Y2 in the block mask pattern group 1, and the block mask patterns A1 through AN are arranged along the direction Y1 in the block mask pattern group 2. In addition, the block mask patterns B1 through BN are arranged along the direction Y2 in the block mask pattern group 3, and the block mask patterns B1 through BN are arranged along the direction Y1 in the block mask pattern group 4. The pair of block mask pattern groups 1 and 2 have the same block mask patterns A1 through AN, however, the block mask patterns A1 through AN are arranged in mutually opposite order between the two block mask pattern groups 1 and 2. Similarly, the pair of block mask pattern groups 3 and 4 have the same block mask patterns B1 through BN, however, the block mask patterns B1 through BN are arranged in mutually opposite order between the two block mask pattern groups 3 and 4. A number of such pairs of block mask pattern groups provided on the block mask 14 corresponds to the number of frames in 1 semiconductor chip.

In this embodiment of the block mask, each of the block mask patterns A1 through AN and Bi through BN not only include repeating patterns, but also include the apertures for use in the variable rectangular exposure. However, it is not essential to provide the apertures for the variable rectangular exposure on the block mask 14. Further, the number of block mask pattern groups is of course not limited to that of this embodiment, and an arbitrary number of block mask pattern groups may be provided on the block mask 14.

According to the block mask of the present invention, it is possible to form all of the necessary repeating patterns on the block mask. In addition, since the repeating patterns are arranged on the block mask depending on the order in which the repeating patterns are used at the time of the exposure, the repeating patterns on the block mask successively enter the deflectable region of the electron beam in the order required for the exposure when the mask stage is continuously moved.

Figure 6:
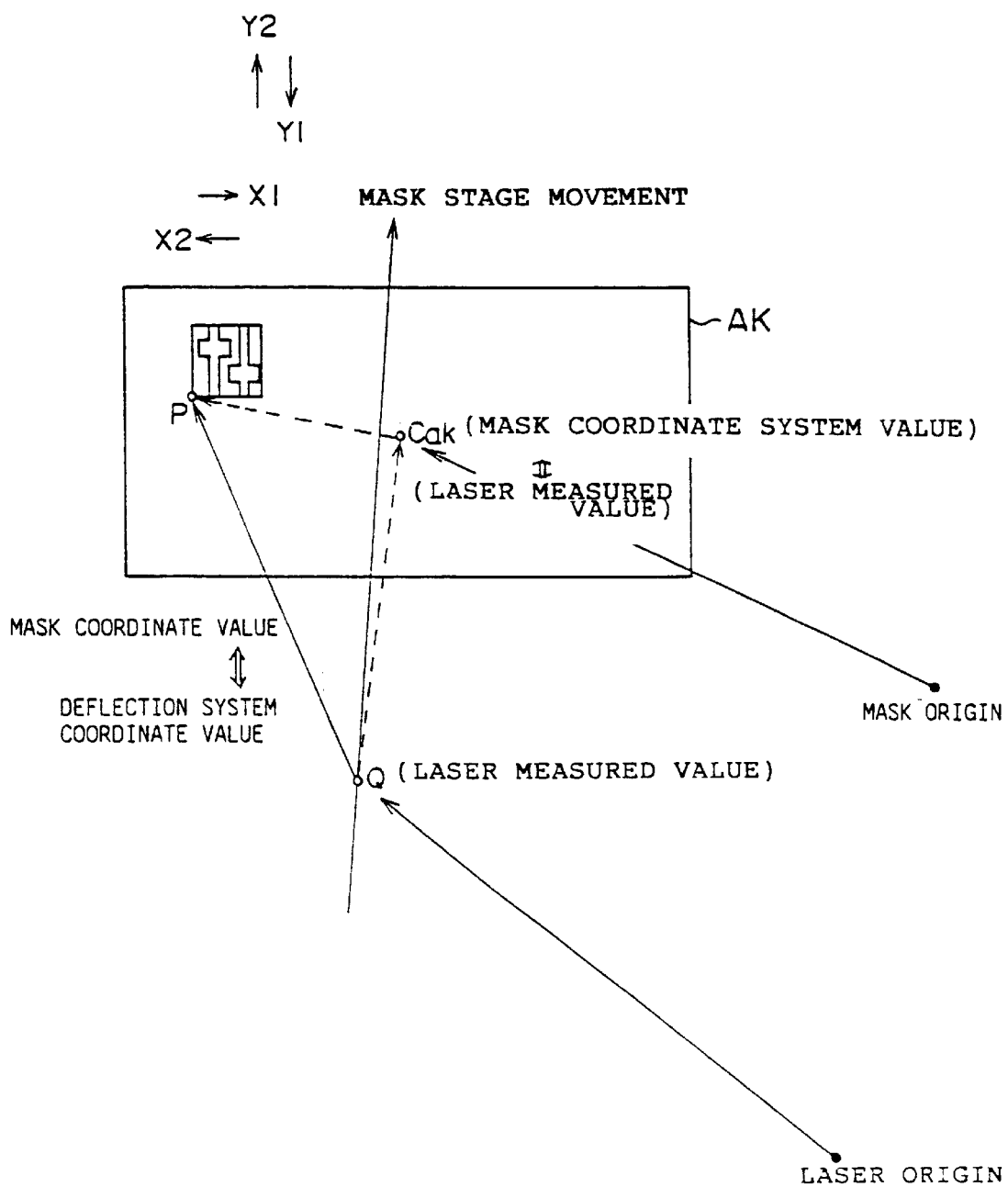
FIG. 6 is a diagram for explaining control of an electron beam in the embodiment of the exposure method.

FIG. 6 is a diagram for explaining the control of the electron beam in this embodiment of the exposure method. It will be assumed for the sake of convenience that the mask stage is located at a position to carry out the exposure using a block mask pattern AK of the block mask 14. In this case, it is also assumed that the pattern positions, that is, the position of the patterns included in the block mask pattern AK, are given by a mask coordinate system which determines the position of the block mask pattern AK by taking a center Cak of the block mask pattern AK as the origin.

A present position Q of the mask stage is measured with a high precision by the laser interferometer that is mounted on the mask stage. When a mask pattern P within the block mask pattern AK is designated by the exposure pattern data, a deflection vector (deflection data) corresponding to a vector QP is generated and the mask pattern P is selected. The position coordinate of the center Cak is given in the mask coordinate system, but the block mask 14 is pre-aligned at the time when the block mask 14 is mounted on the mask stage, so as to transform the position coordinate of the center Cak into a position coordinate in the mask stage coordinate system. It is possible to know a position on the block mask 14 by detecting a mark pattern or the like provided on the block mask 14. Accordingly, the mask stage coordinate with respect to a vector QCak can be calculated in real-time based on the value that is measured by the laser interferometer at the present position Q. By subjecting the mask stage coordinate which is calculated in this manner to an inverse coordinate transformation, it is possible to obtain the coordinate of the vector QCak in the mask coordinate system.

On the other hand, the position coordinate of a mask pattern P is given in the mask coordinate system having Cak as the center, and it is possible to obtain the coordinate of a vector CakP in the mask coordinate system based on the position coordinate of the mask pattern P. It is possible to determine the coordinate of the vector QP in the mask coordinate system by adding the coordinates of the vector QCak and the vector CakP in the mask coordinate system. The deflection intensity, deflection distortion and the like with respect to the deflectors of the electron beam exposure apparatus for selecting the mask pattern P of the block mask AK by deflecting the electron beam are described in the mask coordinate system. Hence, when the coordinate of the vector QP in the mask coordinate system is determined, it is possible to calculate the deflection data for deflecting the electron beam by a deflection quantity corresponding to this vector QP.

For example, the above calculation is made in a control unit or an arithmetic circuit of the electron beam exposure apparatus. The arithmetic coefficients or operators used for the arithmetic operations may be determined and set in registers or the like when adjusting the electron beam or making the pre-alignment of the block mask. As a result, the arithmetic operations required for the calculation can be carried out by a pipeline processing.

It is desirable to also generate in the control unit or arithmetic circuit a deflectability judgement signal which indicates whether or not the deflection data calculated in the control unit or arithmetic circuit fall within the deflectable regions of the deflectors. In this case, since a drawability judgement signal is conventionally used to indicate whether or not the wafer stage that is continuously moved is located at a position where the electron beam can draw with respect to the wafer on the wafer stage, a control signal corresponding to a logical product (AND) of this drawability judgement signal and the above deflectability judgement signal can be obtained. In other words, the start of the exposure operation of the electron beam exposure apparatus can be controlled based on the control signal.

Figure 1:
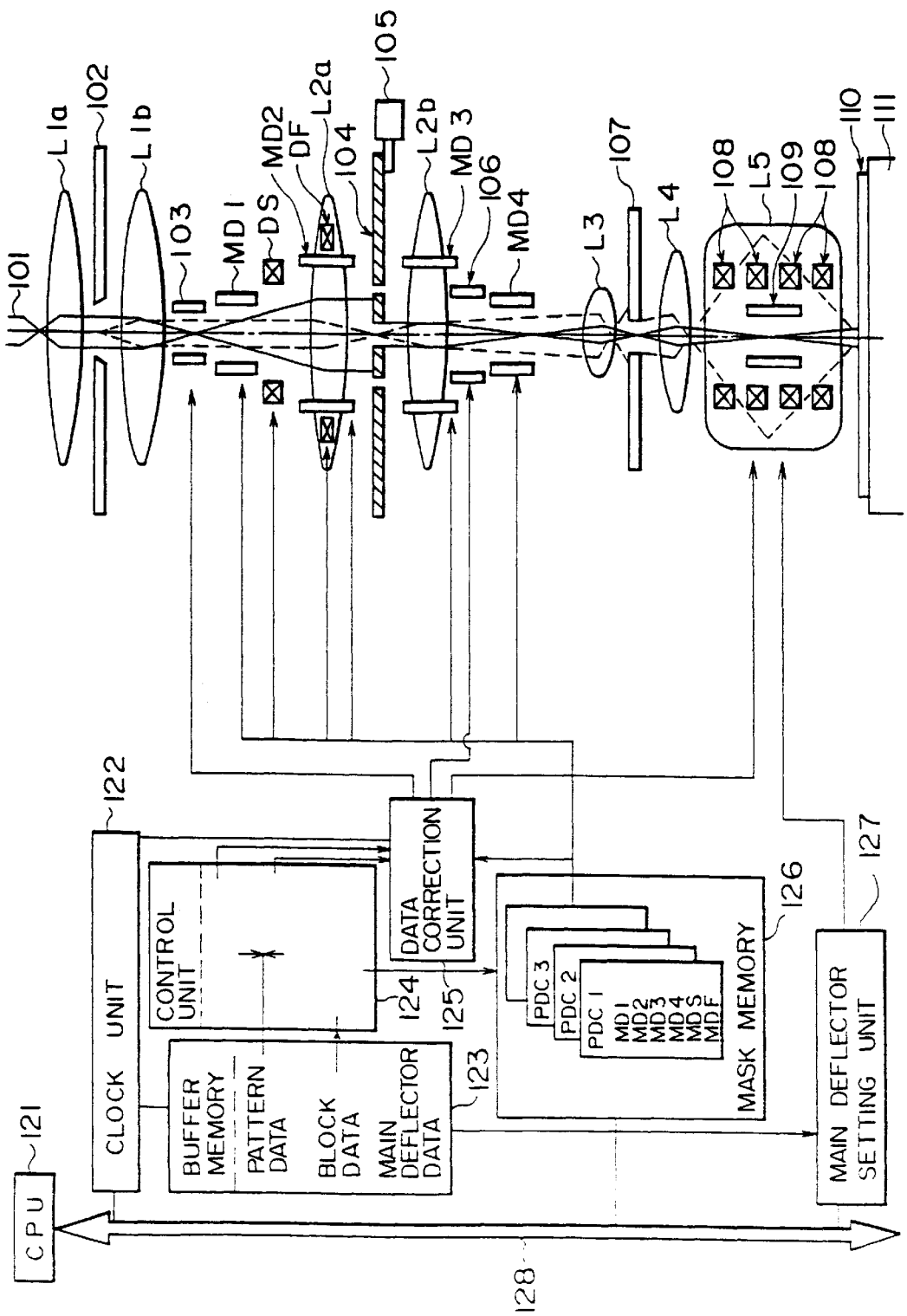
FIG. 1 is a diagram generally showing an example of a conventional electron beam exposure apparatus.
Figure 7:
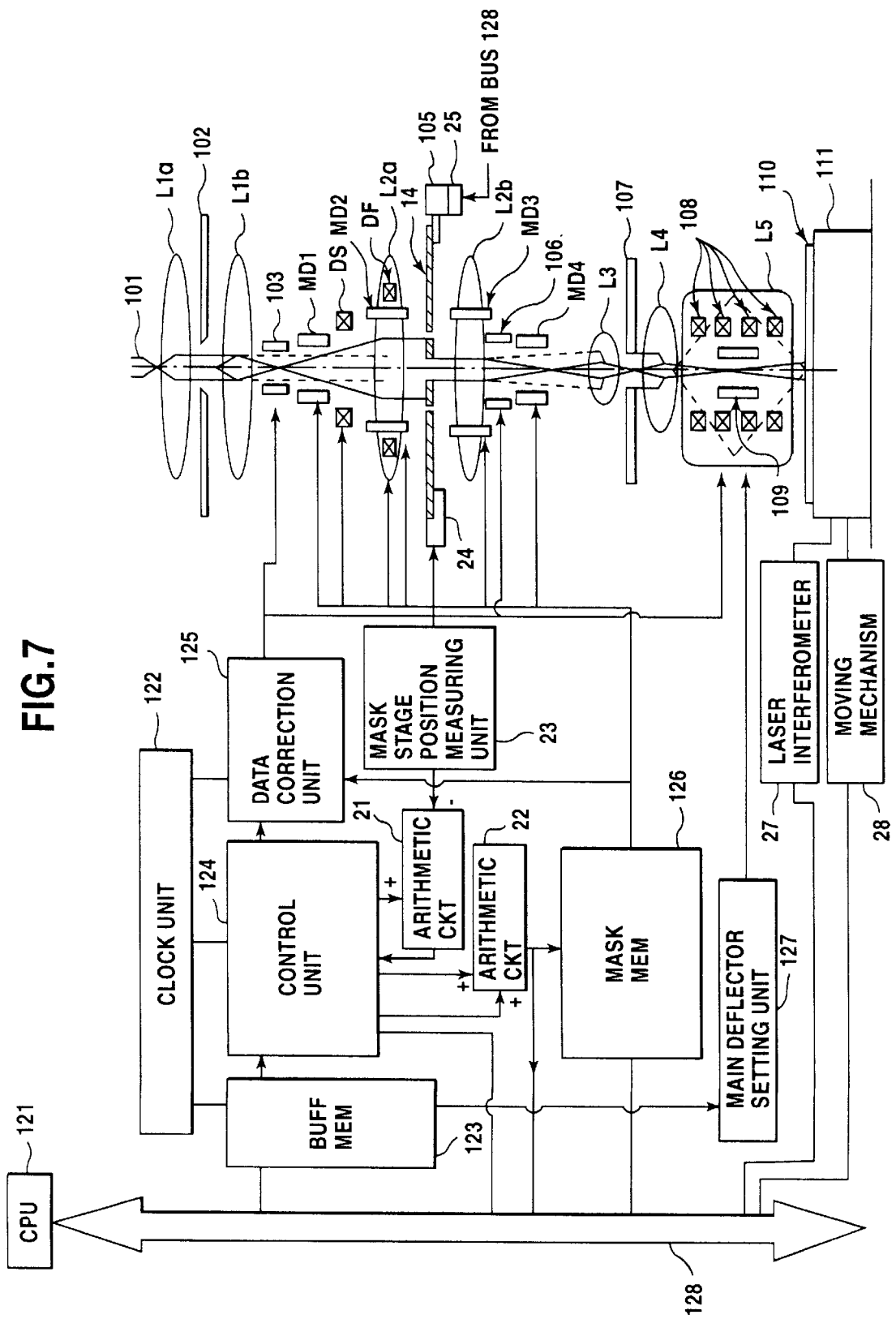
FIG. 7 is a diagram showing an embodiment of a charged particle beam exposure apparatus according to the present invention.

Next, a description will be given of an embodiment of the charged particle beam exposure apparatus according to the present invention, by referring to FIG. 7. In FIG. 7, those parts which are substantially the same as those corresponding parts in FIG. 1 are designated by the same reference numerals, and a description thereof will be omitted.

In this embodiment of the exposure apparatus, arithmetic circuits 21 and 22, a mask stage position measuring unit 23, a laser interferometer 24, and a mask stage moving mechanism 25 are provided as shown in FIG. 7. FIG. 7 also shows a laser interferometer 27 which measures the position of the wafer stage 111, and a stage moving mechanism 28 which moves the wafer stage 111. The control unit 124, the data correction unit 125, the main deflector setting unit 127, and the arithmetic circuits 21 and 22 may be formed by one or a plurality of processors connected to the bus 128.

When it is assumed that the mask stage 105 is at the position to make the exposure using the block mask pattern AK of the block mask 14 shown in FIG. 6, the pattern positions of the patterns included in the block mask pattern AK are given in the mask coordinate system from the control unit 124. As described above, the mask coordinate system determines the position of the block mask pattern AK using the center Cak as the origin. In addition, the control unit 124 also obtains the coordinate of the center Cak of the block mask pattern AK in the mask coordinate system. The present position Q of the mask stage 105 is measured with a high precision by the laser interferometer 24 which is mounted on the mask stage 105, and the coordinate of the present position Q in the mask stage coordinate system is supplied from the mask stage position measuring unit 23 to the arithmetic circuit 21.

When the mask pattern P within the block mask pattern AK is designated by the exposure pattern data, the control unit 124 generates a deflection vector (deflection data) corresponding to the vector QP, and the mask pattern P is selected. The position coordinate of the center Cak is given in the mask coordinate system, but the pre-alignment of the block mask 14 is made at the time when the block mask 14 is mounted on the mask stage 105, so as to transform the position coordinate of the center Cak into the position coordinate in the mask stage coordinate system. For example, it is possible to know a position on the block mask 14 by detecting the mask pattern or the like on the block mask 14. Hence, the control unit 124 supplies the position coordinate of the center Cak in the mask stage coordinate system to the arithmetic circuit 21. As a result, the arithmetic circuit 21 obtains a vector QCak by subtracting the position coordinate of the present position Q of the mask stage 105 from the position coordinate of the center Cak in the mask stage coordinate system. Accordingly, the mask stage coordinate of the vector QCak can be calculated in real-time based on the value which is measured by the laser interferometer 24 at the present position Q.

It is possible to obtain the coordinate of the vector QCak in the mask coordinate system by subjecting the calculated mask stage coordinate of the vector QCak to an inverse coordinate transformation in the control unit 124.

On the other hand, the position coordinate of the mask pattern P is given in the mask coordinate system having Cak as the center from the control unit 124. This coordinate of the mask pattern P in the mask coordinate system, that is, the coordinate of the vector CakP in the mask coordinate system, is supplied to the arithmetic circuit 22 and is added to the coordinate of the vector QCak in the mask coordinate system that is obtained in the arithmetic circuit 21 and subjected to the coordinate transformation in the control unit 124. Thus, it is possible to obtain from the arithmetic circuit 22 the coordinate of the vector QP in the mask coordinate system.

The arithmetic circuit 22 may add the coordinates of the vectors CakP and QCak in the mask stage coordinate system. But in this case, it is necessary to again transform the coordinate of the vector QP into the coordinate of the mask coordinate system by the control unit 124, because the coordinate of the vector QP will be obtained in the mask stage coordinate system. The calculation may be made in any coordinate system as long as the coordinate the vector QP obtained from the arithmetic circuit 22 is obtained in the mask coordinate system.

The deflection intensity, deflection distortion and the like with respect to the first through fourth (pattern selecting) deflectors MD1 through MD4 of the electron beam exposure apparatus for selecting the mask pattern P of the block mask AK by deflecting the electron beam are described in the mask coordinate system. Accordingly, when the coordinate of the vector QP is determined in the mask coordinate system, it is possible to calculate the deflection data for deflecting the electron beam by a deflection quantity corresponding to the vector QP.

The above described calculations may be made in the control unit 124 and the arithmetic circuits 21 and 22. But in this embodiment of the exposure apparatus, the deflection data calculated in advance with respect to each of the vectors are stored in the mask memory 126, and the corresponding deflection data is read from the mask memory 126 based on the vector QP that is obtained from the arithmetic circuit 22. The deflection data read from the mask memory 126 is supplied to the first through fourth deflectors MDI through MD4. The mask memory 126 also stores other data including correction data which are to be supplied to the dynamic mask stigmator DS and the dynamic mask focus coil DF, and these correction data are also read from the mask memory 126 and supplied to the dynamic mask stigmator DS and the dynamic mask focus coil DF.

Because the present position Q of the mask stage 105 is known as described above, the control unit 124 generates based on the vector QP obtained from the arithmetic circuit 22 the deflectability judgement signal which indicates whether or not the deflection data read from the mask memory 126 fall within the deflectable regions of the first through fourth deflectors MD1 through MD4. In this case, the control unit 124 already recognizes the target moving position of the wafer stage 111 from the exposure data, and also the present position of the wafer stage 111 from the signal received from the laser interferometer 27. Hence, based on such information, the control unit 124 can generate the drawability judgement signal which indicates whether or not the wafer stage 111 which is continuously moved is located at a position where the electron beam can draw with respect to the wafer 110 on the wafer stage 111, in a manner similar to the conventional case. Therefore, by obtaining a control signal corresponding to the logical product (AND) of the drawability judgement signal and the deflectability judgment signal can be obtained in the control unit 124, it is possible to control the start of the exposure operation of the electron beam exposure apparatus based on this control signal. Consequently, the exposure operation is started only when the deflection data fall within the deflectable regions of the first through fourth deflectors MD1 through MD4 and the wafer stage 111 which is continuously moved is located at the position where the electron beam can draw with respect to the wafer 110 on the wafer stage 111.

Figure 8:
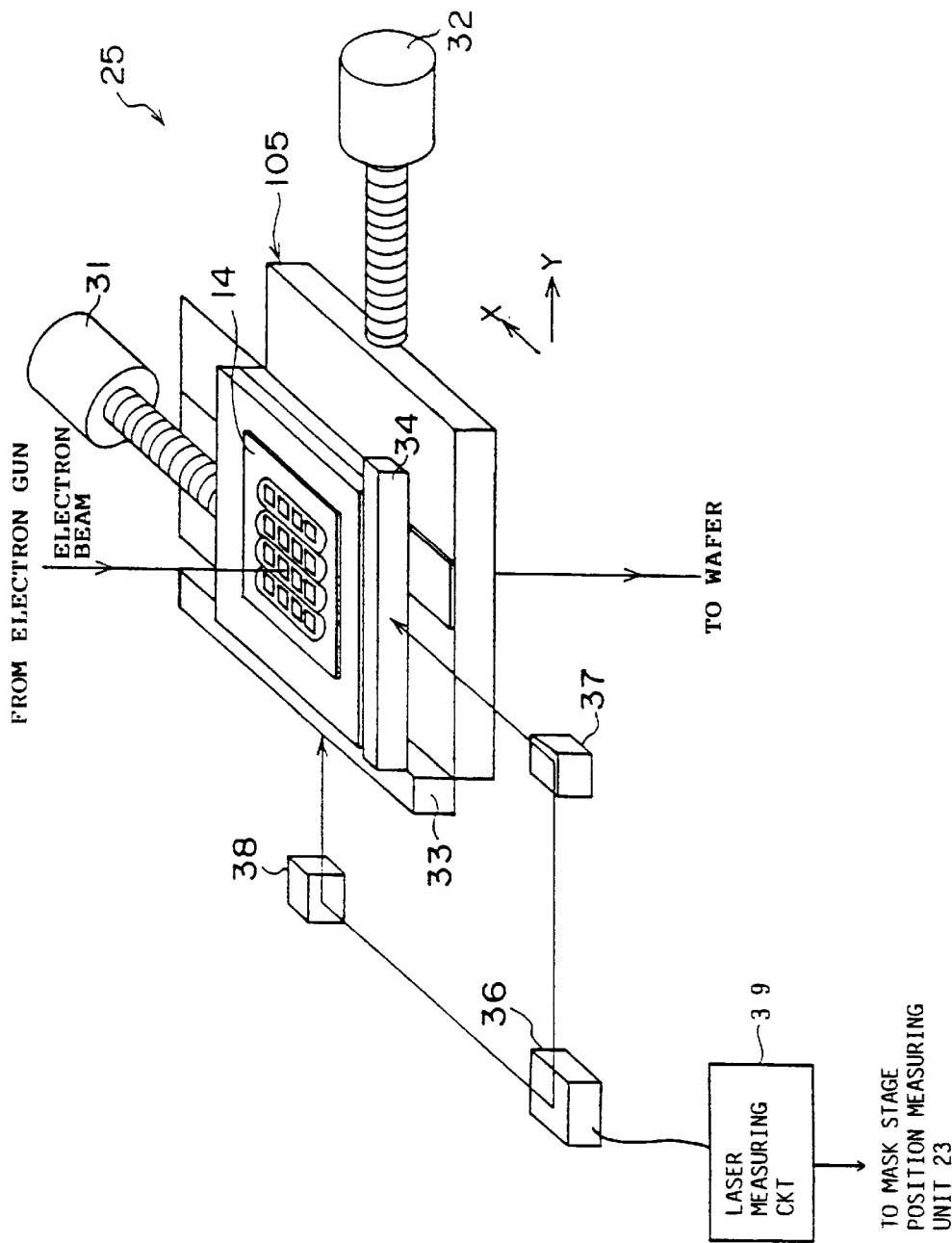
FIG. 8 is a perspective view showing an embodiment of a mask stage portion shown in FIG. 7.

FIG. 8 shows a perspective view of an embodiment of a mask stage portion shown in FIG. 7.

In FIG. 8, the mask stage moving mechanism 25 includes a motor 31 which drives the mask state 105 in the direction X, and a motor 32 which drives the mask stage 105 in the direction Y. A Y-side mirror 33 and a X-side mirror 34 are provided on the mask stage 105. The laser interferometer 24 includes a laser beam output part 36, mirrors 37 and 38, and a laser measuring circuit 39. A laser beam output from the laser beam output part 36 is irradiated on the X-side mirror 34 via the mirror 37 on one hand, and is irradiated on the Y-side mirror 33 via the mirror 38 on the other. The laser beams reflected by the X-side and Y-side mirrors 34 and 33 are returned to the laser beam output part 36 via the respective mirrors 37 and 38, thereby generating interference of the laser beams. The laser measuring circuit 39 obtains the X and Y coordinates of the mask stage 105 based on the laser beam interference generated at the laser beam output part 36, and supplies the X and Y coordinates to the mask state position measuring unit 23.

Figure 9:
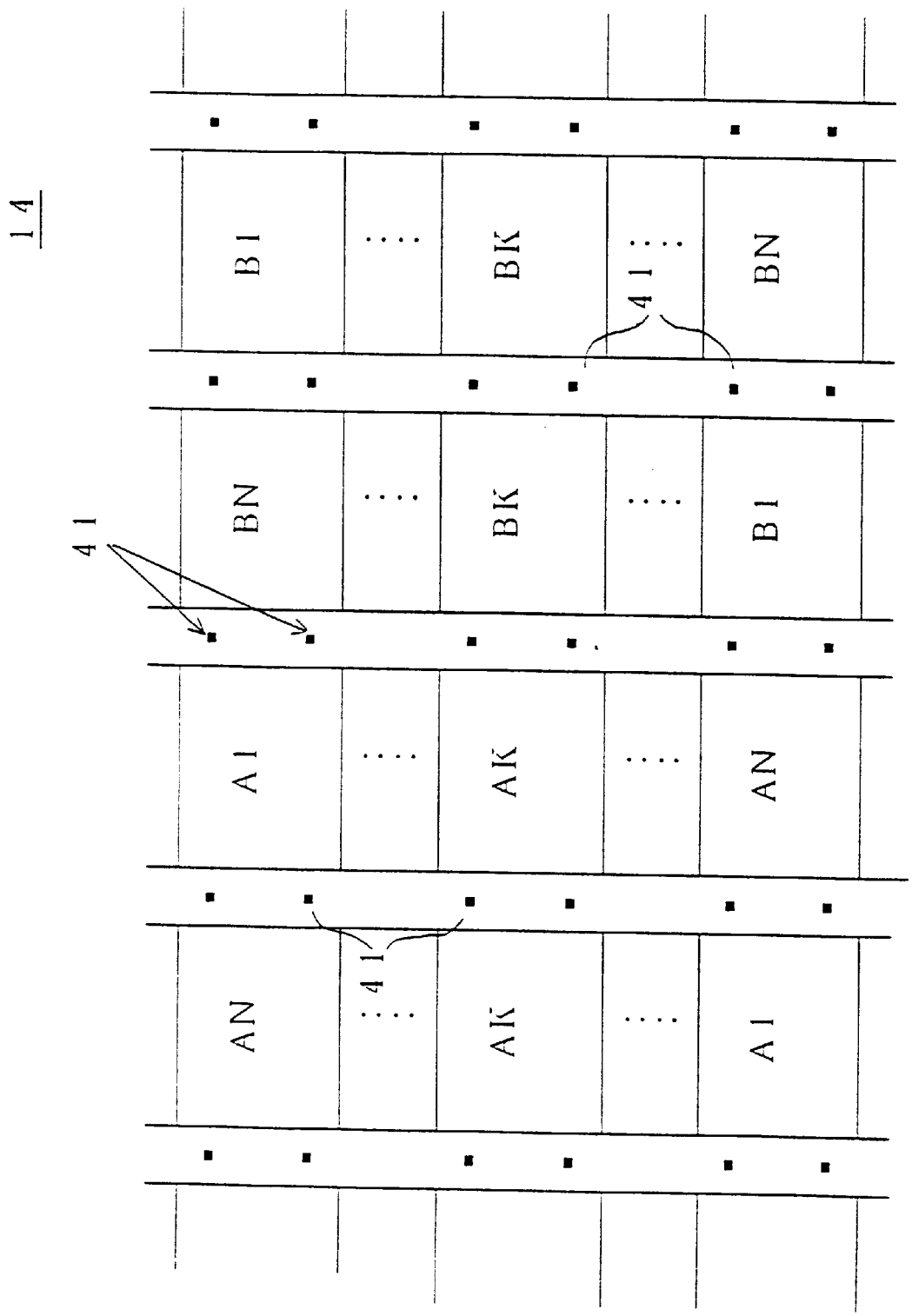
FIG. 9 is a plan view showing a part of another embodiment of the block mask according to the present invention.

FIG. 9 shows a plan view of a part of another embodiment of the block mask according to the present invention. In FIG. 9, those parts which are the same as those corresponding parts in FIG. 5 are designated by the same reference numerals, and a description thereof will be omitted.

In this embodiment of the block mask, a plurality of mark patterns 41 to be used for detecting the position on the block mask 14 are provided between the block mask pattern groups. Initially, when mounting the block mask 14 on the mask stage 105 and making the pre-alignment of the block mask 14, the electron beam is deflected to pass through a predetermined mark pattern 41. The intensity of the electron beam which passes through the predetermined mark pattern 41 is detected by a detector (not shown) which is provided at a predetermined position on the wafer stage 111. Such a process is carried out with respect to a plurality of mark patterns 41 when making the pre-alignment of the block mask 14, so that the position of the block mask 14 with respect to the mask stage 105 is detected. Based on the detected position of the block mask 14 with respect to the mask stage 105, it is possible to make the coordinate transformation described above between the mask coordinate system and the mask stage coordinate system.

FIG. 10 shows a flow chart for explaining the overall operation of the embodiment of the exposure apparatus.

In FIG. 10, a step S1 mounts the block mask 14 on the mask stage 105. A step S2 moves the mask stage 105 by the mask stage moving mechanism 25 to a position such that the electron beam is transmitted through one mark pattern 41. A step S3 measures the conditions that make the electron beam transmitted through the one mark pattern 41 to irradiate the detector which is provided at the predetermined position on the wafer stage 111. The steps S2 and S3 are repeated with respect to all of the mark patterns 41 on the block mask 14.

A step S4 determines the deflection correction value of the electron beam at each position on the block mask 14. In addition, a step S5 moves the wafer stage 111 to an exposure start position of the wafer 110 by the wafer stage moving mechanism 28, and moves the mask stage 105 to an exposure start position of the block mask 14 by the mask stage moving mechanism 25. In this case, the exposure start position on the wafer 110 refers to the exposure start position for the first 1 frame shown in FIG. 3, while the exposure start position on the block mask 14 refers to the exposure start position corresponding to the exposure start position on the wafer 110 for the first 1 frame. Thereafter, the wafer stage 111 and the mask stage 105 are respectively moved continuously by the wafer stage moving mechanism 28 and the mask stage moving mechanism 25.

A step S7 deflects the electron beam by controlling the first through fourth deflectors MDI through MD4 and the main and sub deflectors 108 and 109 when the exposure region on the wafer 110 and the block mask pattern on the block mask 14 respectively enter the deflectable range of the electron beam. A step S8 controls the first through fourth deflectors MD1 through MD4 to select by the electron beam the pattern within one block mask pattern of the block mask 14, and exposes the pattern within this one block mask pattern on the wafer 110. A step S9 decides whether or not the deflectable range of the electron beam has reached the end of the mask stage 105, and if the decision result is NO, the process returns to the step S6 so that the steps S6 through S9 are repeated until the exposure amounting to 1 frame width F on the wafer 110 ends.

On the other hand, if the decision result in the step S9 is YES, a step S10 decides whether or not an adjacent frame to be exposed exists. If the decision result in the step S10 is YES, the wafer stage 111 is moved by the wafer stage moving mechanism 28 to an exposure start position for the adjacent 1 frame on the wafer 110, the mask stage 105 is moved by the mask stage moving mechanism 25 to a corresponding adjacent exposure start position on the block mask 14, and the process returns to the step S4 to expose this adjacent 1 frame. On the other hand, if the decision result in the step S10 is NO, the exposure process ends.

In the block mask according to the present invention, the arrangement of each of the block mask patterns is not limited to those shown in FIGS. 5 and 9. The block mask patterns may take any arrangement on the block mask as long as the mask stage 105 and the wafer stage 111 can easily and smoothly moved depending on the exposure sequence.

In addition, the application of the block mask according to the present invention and the exposure method and apparatus according to the present invention using the block mask is not limited to the electron beam exposure, and the present invention is of course similarly applicable to the charged particle beam exposure.

Further, the present invention is not limited to these embodiments, but various variations and modifications may be made without departing from the scope of the present invention.

What is claimed is:

1. A charged particle beam exposure method for making a block exposure on a member using a block mask which has a plurality of block mask patterns respectively including repeating patterns, said charged particle beam exposure method comprising the steps of:
    (a) mounting on a movable stage a block mask having the block mask patterns arranged in an order dependent on an exposure sequence; and
    (b) deflecting a charged particle beam that is transmitted through said block mask and reaches the member based on deflection data while continuously moving the block mask by said movable stage so that a pattern in the plurality of block mask patterns is exposed on the member.

2. The charged particle beam exposure method as claimed in claim 1, which further comprises the steps of:
    (c) continuously moving the member.

3. The charged particle beam exposure method as claimed in claim 1, wherein said block mask patterns includes apertures for making a variable rectangular exposure which varies a size of an exposed pattern by varying an overlap of one of said apertures and a beam spot of the charged particle beam, and said step (b) exposes the pattern in the plurality of block mask patterns including at least one of the apertures.

4. The charged particle beam exposure method as claimed in claim 1, wherein said block mask has mark patterns, and said charged particle beam exposure method further comprises the steps of:
    (c) detecting a position on said block mask based on said mark patterns.

5. The charged particle beam exposure method as claimed in claim 1, which further comprises the steps of:
    (c) generating the deflection data based on a present position of the block mask, reference points of each of the block mask patterns, and positions of patterns within each of the bock mask patterns with reference to each of the reference points.

6. The charged particle beam exposure method as claimed in claim 1, which further comprises the steps of:
    (c) obtaining a first signal indicating that a position of the block mask falls within a deflectable range of the charged particle beam on the block mask and a second signal indicating that a position of the member falls within a drawable range of the charged particle beam on the member, and controlling a start of an exposure operation based on a logical product of the first and second signals.

7. A charged particle beam exposure apparatus for making a block exposure on a member using a block mask which has a plurality of block mask patterns respectively including repeating patterns, said block mask patterns being arranged in an order dependent on an exposure sequence, said charged particle beam exposure apparatus comprising:
    first means for continuously moving said block mask; and
    second means for deflecting a charged particle beam that is transmitted through said block mask and reaches the member based on deflection data while continuously moving the block mask by said first means so that a pattern in the plurality of block mask patterns is exposed on the member.

8. The charged particle beam exposure apparatus as claimed in claim 7, which further comprises third means for continuously moving the member.

9. The charged particle beam exposure apparatus as claimed in claim 7 wherein said block mask patterns includes apertures for making a variable rectangular exposure which varies a size of an exposed pattern by varying an overlap of one of said apertures and a beam spot of the charged particle beam, and said second means exposes the pattern in the plurality of block mask patterns including at least one of the apertures.

10. The charged particle beam exposure apparatus as claimed in claim 7, wherein said block mask has mark patterns, and said charged particle beam exposure apparatus further comprises means for detecting a position on said block mask based on said mark patterns.

11. The charged particle beam exposure apparatus as claimed in claim 7, which further comprises means for generating the deflection data based on a present position of the block mask, reference points of each of the block mask patterns, and positions of patterns within each of the bock mask patterns with reference to each of the reference points.

12. The charged particle beam exposure apparatus as claimed in claim 7, which further comprises means for obtaining a first signal indicating that a position of the block mask falls within a deflectable range of the charged particle beam on the block mask and a second signal indicating that a position of the member falls within a drawable range of the charged particle beam on the member, and means for controlling a start of an exposure operation based on a logical product of the first and second signals.

* * * * *